United States Patent
Sulyman et al.

(10) Patent No.: US 12,211,734 B2
(45) Date of Patent: Jan. 28, 2025

(54) LIFT PIN MECHANISM

(71) Applicant: Applied Materials, Inc., Santa Clara, CA (US)

(72) Inventors: Alexander Sulyman, San Francisco, CA (US); Carlaton Wong, Sunnyvale, CA (US); Rajinder Dhindsa, Pleasanton, CA (US); Timothy Joseph Franklin, Campbell, CA (US); Steven Babayan, Los Altos, CA (US); Anwar Husain, Pleasonton, CA (US); James Hugh Rogers, Los Gatos, CA (US); Xue Yang Chang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 366 days.

(21) Appl. No.: 17/688,712

(22) Filed: Mar. 7, 2022

(65) Prior Publication Data
US 2022/0293452 A1 Sep. 15, 2022

Related U.S. Application Data

(60) Provisional application No. 63/160,724, filed on Mar. 12, 2021.

(51) Int. Cl.
*H01L 21/67* (2006.01)
*H01L 21/683* (2006.01)
*H01L 21/687* (2006.01)

(52) U.S. Cl.
CPC .... *H01L 21/68742* (2013.01); *H01L 21/6833* (2013.01)

(58) Field of Classification Search
CPC ......... H01L 21/68742; H01L 21/68721; H01L 21/6835
See application file for complete search history.

(56) References Cited

U.S. PATENT DOCUMENTS

| 6,673,196 B1 | 1/2004 | Oyabu |
| 10,857,655 B2 | 12/2020 | Cuvalci et al. |

(Continued)

FOREIGN PATENT DOCUMENTS

| JP | H0444317 A | 2/1992 |
| JP | H07-161800 A | 6/1995 |

(Continued)

OTHER PUBLICATIONS

PCT International Search Report and Written Opinion for PCT/US2022/019277 dated Jun. 17, 2022.

*Primary Examiner* — Lee D Wilson
(74) *Attorney, Agent, or Firm* — MOSER TABOADA / APPLIED MATERIALS, INC.

(57) ABSTRACT

Methods and apparatus for a lift pin mechanism for substrate processing chambers are provided herein. In some embodiments, the lift pin mechanism includes a lift pin comprising a shaft with a top end, a bottom end, and a coupling end at the bottom end; a bellows assembly disposed about the shaft. The bellows assembly includes an upper bellows flange having an opening for axial movement of the shaft; a bellows having a first end coupled to a lower surface of the upper bellows flange such that the shaft extends into a central volume surrounded by the bellows; and a bellows guide assembly coupled to a second end of the bellows to seal the central volume. The shaft is coupled to the bellows guide assembly at the coupling end. The bellows guide assembly is axially movable to move the lift pin with respect to the upper bellows flange.

20 Claims, 7 Drawing Sheets

(56) References Cited

U.S. PATENT DOCUMENTS

| | | |
|---|---|---|
| 2007/0089836 A1 | 4/2007 | Metzner et al. |
| 2010/0187777 A1 | 7/2010 | Hao |
| 2010/0200545 A1 | 8/2010 | Koelmel et al. |
| 2011/0236162 A1 | 9/2011 | Shikayama et al. |
| 2011/0287631 A1 | 11/2011 | Yamamoto |
| 2017/0032997 A1 | 2/2017 | Willwerth et al. |
| 2018/0090361 A1 | 3/2018 | Sasaki et al. |
| 2019/0080955 A1 | 3/2019 | Lee et al. |
| 2019/0252229 A1 | 8/2019 | Ishii et al. |
| 2020/0075390 A1 | 3/2020 | Dur et al. |
| 2020/0266088 A1 | 8/2020 | Kosakai et al. |
| 2022/0028720 A1* | 1/2022 | Sulyman ............ H01L 21/6831 |
| 2022/0044957 A1 | 2/2022 | Dur et al. |
| 2022/0076987 A1* | 3/2022 | Eschenmoser .......... G01P 15/18 |
| 2022/0293452 A1* | 9/2022 | Sulyman ........... H01L 21/68742 |
| 2022/0336258 A1* | 10/2022 | Srivastava ........ H01L 21/68792 |
| 2023/0207378 A1* | 6/2023 | Kim ................. H01L 21/67109 |
| | | 156/345.24 |
| 2023/0215705 A1* | 7/2023 | Jeong ................ H01L 21/68742 |
| | | 156/345.54 |

FOREIGN PATENT DOCUMENTS

| | | |
|---|---|---|
| JP | 2009-033005 | 2/2009 |
| JP | 3154629 U | 10/2009 |
| JP | 2016187056 A | 10/2016 |

\* cited by examiner

LIFT PIN MECHANISM

CROSS-REFERENCE TO RELATED APPLICATIONS

This application claims benefit of U.S. provisional patent application Ser. No. 63/160,724, filed Mar. 12, 2021, which is herein incorporated by reference in its entirety.

FIELD

Embodiments of the present disclosure generally relate to methods and apparatus for processing a substrate.

BACKGROUND

Semiconductor processing systems, such as plasma processing chambers include substrate supports having electrostatic chucks for supporting substrates during processing of such substrates. Lift pin holes are formed through the electrostatic chuck accommodate lift pins that raise and/or lower substrates onto a support surface of the electrostatic chuck.

In plasma processing chambers, the electrostatic chuck is subjected to high-power radio frequency (RF) fields and high-density plasmas in the vicinity of the substrate. The inventors have observed that, in such plasma processing chambers, arcing can occur in and through lift pin holes damaging the substrate support components.

Accordingly, the inventors have provided embodiments of improved lift pin assemblies.

SUMMARY

Methods and apparatus for a lift pin mechanism for substrate processing chambers is provided herein. In some embodiments, the lift pin mechanism includes a lift pin comprising an elongated shaft, a top end of the shaft, a bottom end of the shaft, and a coupling end at the bottom end of the shaft; a bellows assembly disposed about the shaft. The bellows assembly comprises an upper bellows flange having an opening to facilitate axial movement of the shaft therethrough; a bellows having a first end coupled to a lower surface of the upper bellows flange such that the shaft extends into a central volume surrounded by the bellows; and a bellows guide assembly coupled to a second end of the bellows to seal the central volume proximate the second end of the bellows, wherein the shaft is coupled to the bellows guide assembly at the coupling end of the shaft, and wherein the bellows guide assembly is axially movable with respect to the upper bellows flange such that axial movement of the bellows guide assembly with respect to the upper bellows flange axially moves the lift pin with respect to the upper bellows flange.

In some embodiments, a substrate support includes: a support plate configured to support a substrate; and a plurality of lift pin mechanisms as described in any of the embodiments disclosed herein disposed within the substrate support, wherein the support plate includes a plurality of openings having corresponding ones of the lift pins movably disposed therethrough, and wherein the bellows assembly is disposed within the support plate.

In some embodiments, a substrate support includes: an electrostatic chuck; a mounting plate; a radio frequency (RF) electrode disposed between the electrostatic chuck and the mounting plate; and a plurality of lift pin mechanisms disposed within the substrate support and configured to allow a corresponding plurality of lift pins to pass through the electrostatic chuck. Each of the plurality of lift pin mechanisms can be as described in any of the embodiments disclosed herein. In some embodiments, each of the plurality of lift pin mechanisms can include a lift pin comprising an elongated shaft, a top end of the shaft, and a coupling end at the bottom of the shaft; and a bellows assembly disposed about the shaft. In some embodiments, the bellows assembly comprises an upper bellows flange having an opening to facilitate axial movement of the shaft therethrough, a bellows having a first end coupled to a lower surface of the upper bellows flange such that the shaft extends into a central volume surrounded by the bellows, and a bellows guide assembly coupled to a second end of the bellows to seal the central volume proximate the second end of the bellows. The shaft is coupled to the bellows guide assembly at the coupling end of the shaft. The bellows guide assembly is axially movable with respect to the upper bellows flange such that axial movement of the bellows guide assembly with respect to the upper bellows flange axially moves the lift pin with respect to the upper bellows flange.

In some embodiments, the bellows guide assembly includes: a first bellows guide defining a cylindrical volume, and a second bellows guide coupled to the first bellows guide and to an end plate located at the second end of the bellows. The first bellows guide and the second bellows guide are movable in an axial direction A first push rod is movable along an axial direction, the first push rod comprising a top end, a bottom end having a diameter smaller than the top end, the first push rod positioned in a corresponding shaped opening in the mounting plate, and below the second bellows guide, wherein a bottom end of the second bellows guide is shaped to mate with the top end of the first push rod, and wherein a downward movement of the first push rod is limited by the mounting plate. A second push rod is movable along the axial direction, the second push rod comprising a top end and a bottom end, the second push rod positioned below the first push rod, wherein the bottom end of the first push rod is shaped to mate with the top end of the second push rod. An actuator comprising a third push rod is coupled to the bottom end of the second push rod, the actuator configured to move the third push rod in an axial direction.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
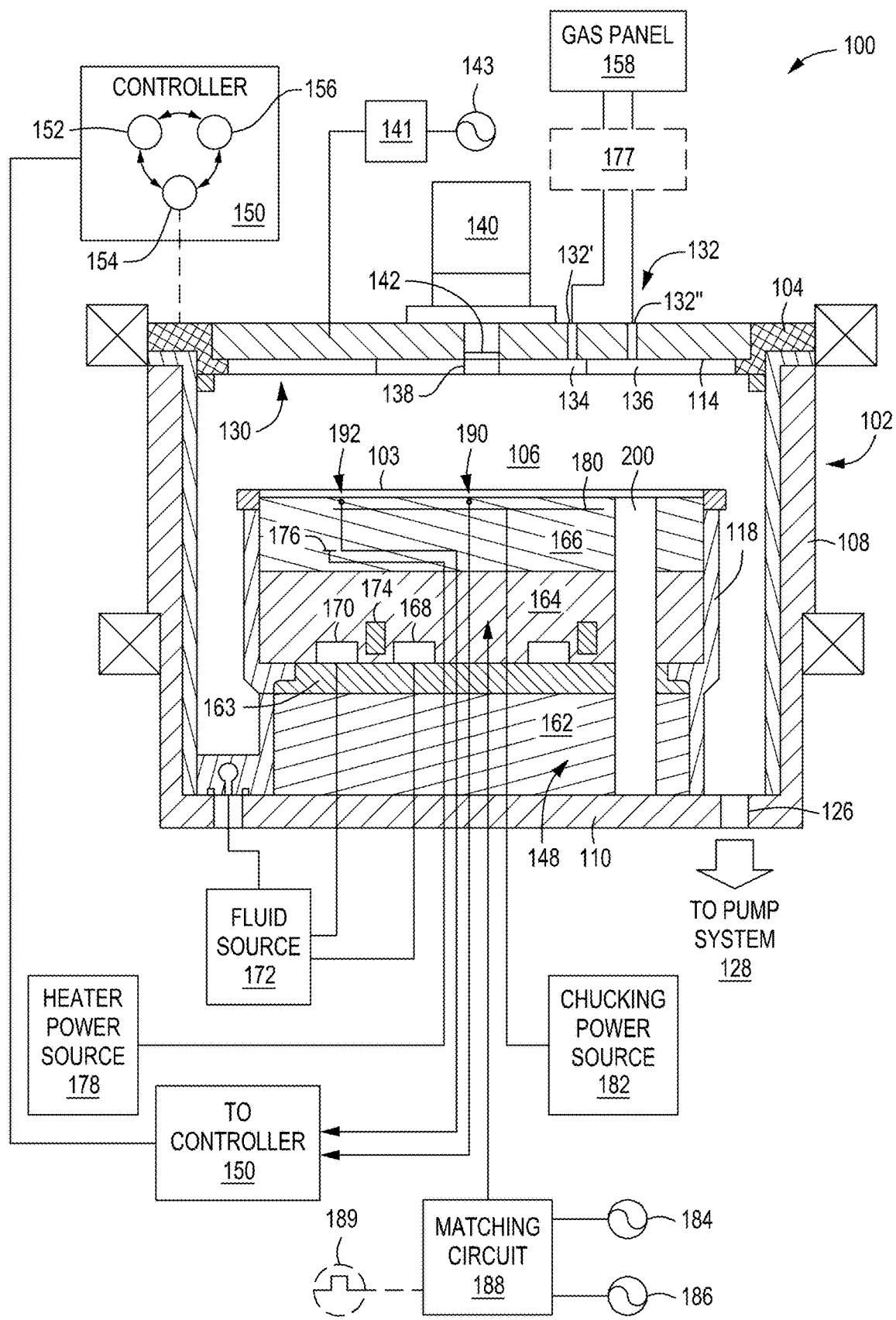
FIG. 1 is a cross-section view of a processing chamber including a lift pin mechanism in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a lift pin mechanism, and substrate processing chamber incorporating one or more lift pin mechanisms are provided herein. Embodiments described herein provide a compact lift pin mechanism including compact bellows, and the compact lift pin mechanism fits inside an electrostatic chuck substrate support. In operation, the bellows are RF hot and the entire lift pin mechanism is kept at high voltage potential, which eliminates line of sight between a substrate positioned on the electrostatic chuck and the ground through lift pin holes. The bellows bias the lift pin axially downward toward the electrostatic chuck for return after being lifted. The bellows also include a flange having a port for allowing pressure control inside the bellows.

FIG. 1 is a cross-section view of a processing chamber 100 including a lift pin mechanism 200 in accordance with at least some embodiments of the present disclosure. While only one lift pin mechanism 200 is illustrated in FIG. 1, multiple lift pin mechanisms 200 may be included. The processing chamber 100 is, for example, a plasma processing chamber, suitable for performing one or more plasma processes (e.g., an etch process, deposition process, etc.) in accordance with the present disclosure. Suitable plasma processing chambers that may be adapted for use with the teachings disclosed herein are available from Applied Materials, Inc. of Santa Clara, CA Other processing chambers may be adapted to benefit from one or more of the methods of the present disclosure.

The processing chamber 100 includes a chamber body 102 and a lid 104 which enclose an interior volume 106 (e.g., a processing volume). The chamber body 102 is typically fabricated from aluminum, stainless steel, or other suitable material. The chamber body 102 generally includes sidewalls 108 and a bottom 110. A substrate support pedestal access port (not shown) is generally defined in a sidewall 108 and a selectively sealed by a slit valve to facilitate entry and egress of a substrate 103 from the processing chamber 100. An exhaust port 126 is defined in the chamber body 102 and couples the interior volume 106 to a pump system 128. The pump system 128 generally includes one or more pumps and throttle valves utilized to evacuate and regulate the pressure of the interior volume 106 of the processing chamber 100. In embodiments, the pump system 128 maintains the pressure inside the interior volume 106 at operating pressures typically between about 1 mTorr to about 500 mTorr, between about 5 mTorr to about 100 mTorr, or between about 5 mTorr to 50 mTorr depending upon process needs.

In embodiments, the lid 104 is sealingly supported on the sidewall 108 of the chamber body 102. The lid 104 may be opened to allow excess to the interior volume 106 of the processing chamber 100. The lid 104 includes a window 142 that facilitates optical process monitoring. In one embodiment, the window 142 is comprised of quartz or other suitable material that is transmissive to a signal utilized by an optical monitoring system 140 mounted outside the processing chamber 100.

The optical monitoring system 140 is positioned to view at least one of the interior volume 106 of the chamber body 102 and/or the substrate 103 positioned on a substrate support pedestal assembly 148 (e.g., a substrate base and a substrate support) through the window 142. In one embodiment, the optical monitoring system 140 is coupled to the lid 104 and facilitates an integrated deposition process that uses optical metrology to provide information that enables process adjustment to compensate for incoming substrate pattern feature inconsistencies (such as thickness, and the like), provide process state monitoring (such as plasma monitoring, temperature monitoring, and the like) as needed.

In embodiments, a gas panel 158 is coupled to the processing chamber 100 to provide process and/or cleaning gases to the interior volume 106. In the example depicted in FIG. 1, inlet ports 132', 132" are provided in the lid 104 to allow gases to be delivered from the gas panel 158 to the interior volume 106 of the processing chamber 100. In embodiments, the gas panel 158 is adapted to provide oxygen and inert gas such as argon, or oxygen and helium process gas or gas mixture through the inlet ports 132', 132" and into the interior volume 106 of the processing chamber 100. In one embodiment, the process gas provided from the gas panel 158 includes at least a process gas including an oxidizing agent such as oxygen gas. In embodiments, the process gas including an oxidizing agent may further comprise an inert gas such as argon or helium. In some embodiments, the process gas includes a reducing agent such as hydrogen and may be mixed with an inert gas such as argon, or other gases such as nitrogen or helium. In some embodiments, a chlorine gas may be provided alone, or in combination with at least one of nitrogen, helium an inert gas such as argon. Non-limiting examples of oxygen containing gas includes one or more of $CO_2$, $N_2O$, $NO_2$, $O_2$, $O_3$, $H_2O$, and the like. Non-limiting examples of nitrogen containing gas includes $N_2$, $NH_3$, and the like. Non-limiting examples of chlorine containing gas includes $Cl_2$, $CCl_4$, HCl, and the like. In embodiments, a showerhead assembly 130 is coupled to an interior surface 114 of the lid 104. The showerhead assembly 130 includes a plurality of apertures that allow the gases flowing through the showerhead assembly 130 from the inlet ports 132', 132" into the interior volume 106 of the processing chamber 100 in a predefined distribution across the surface of the substrate 103 being processed in the processing chamber 100.

In some embodiments, the processing chamber 100 may utilize capacitively coupled RF energy for plasma processing, or in some embodiments, processing chamber 100 may use inductively coupled RF energy for plasma processing. In some embodiments, a remote plasma source 177 may be optionally coupled to the gas panel 158 to facilitate dissociating gas mixture from a remote plasma prior to entering the interior volume 106 for processing. In some embodiments, a RF source power 143 is coupled through a matching network 141 to the showerhead assembly 130. The RF source power 143 typically can operate up to about 10 kV and can produce up to about 10000 W for example between about 200 W to about 5000 W, or between 1000 W to 3000 W, or about 1500 W and optionally at a tunable frequency in a range from about 50 kHz to about 200 MHz.

The showerhead assembly 130 additionally includes a region transmissive to an optical metrology signal. The optically transmissive region or passage 138 is suitable for allowing the optical monitoring system 140 to view the interior volume 106 and/or the substrate 103 positioned on the substrate support pedestal assembly 148. The passage 138 may be a material, an aperture or plurality of apertures formed or disposed in the showerhead assembly 130 that is substantially transmissive to the wavelengths of energy generated by, and reflected to, the optical monitoring system 140. In one embodiment, the passage 138 includes a window 142 to prevent gas leakage through the passage 138. The window 142 may be a sapphire plate, quartz plate or other suitable material. The window 142 may alternatively be disposed in the lid 104.

In one embodiment, the showerhead assembly 130 is configured with a plurality of zones that allow for separate control of gas flowing into the interior volume 106 of the processing chamber 100. In the example illustrated in FIG. 1, the showerhead assembly 130 as an inner zone 134 and an outer zone 136 that are separately coupled to the gas panel 158 through inlet ports 132', 132".

In some embodiments, the substrate support pedestal assembly 148 is disposed in the interior volume 106 of the processing chamber 100 below the gas distribution assembly such as showerhead assembly 130. The substrate support pedestal assembly 148 holds the substrate 103 during processing. The substrate support pedestal assembly 148 generally includes a plurality of lift pins (not shown) disposed therethrough that are configured to lift the substrate 103 from the substrate support pedestal assembly 148 and facilitate exchange of the substrate 103 with a robot (not shown) in a conventional manner. An inner liner 118 may closely circumscribe the periphery of the substrate support pedestal assembly 148.

In one embodiment, the substrate support pedestal assembly 148 includes a mounting plate 162, an insulating plate 163, a facilities plate 164 (e.g., a support base, conductive plate, and/or an RF electrode) and an electrostatic chuck 166 (e.g., a substrate support). In at least some embodiments, the mounting plate 162 comprises a ground plate that surrounds an insulating layer. The mounting plate 162 is coupled to the bottom 110 of the chamber body 102 and includes passages for routing utilities, such as fluids, power lines and sensor leads, among others, to the facilities plate 164 and the electrostatic chuck 166. The electrostatic chuck 166 comprises an electrode 180 (e.g., at least one clamping/chucking electrode), which can be embedded in a ceramic layer, for retaining the substrate 103 below showerhead assembly 130. The electrostatic chuck 166 can be driven by an optional chucking power source 182 to develop an electrostatic force that holds the substrate 103 to the chuck surface, as is conventionally known. Alternatively, the substrate 103 may be retained to the substrate support pedestal assembly 148 by clamping, vacuum, or gravity.

A base 164 or electrostatic chuck 166 may include at least one optional embedded heater 176, at least one optional embedded isolator 174 and a plurality of conduits 168, 170 to control the lateral temperature profile of the substrate support pedestal assembly 148. The conduits 168, 170 are fluidly coupled to a fluid source 172 that circulates a temperature regulating fluid therethrough. The heater 176 is regulated by a power source 178. The conduits 168, 170 and heater 176 are utilized to control the temperature of the facilities plate 164, heating and/or cooling the electrostatic chuck 166 and ultimately, the temperature profile of the substrate 103 disposed thereon. The temperature of the electrostatic chuck 166 and the facilities plate 164 may be monitored using a plurality of temperature sensors 190, 192. The electrostatic chuck 166 may further include a plurality of gas passages (not shown), such as grooves, that are formed in a substrate support pedestal supporting surface of the electrostatic chuck 166 and fluidly coupled to a source of a heat transfer (or backside) gas, such as helium (He). In operation, the backside gas is provided at controlled pressure into the gas passages to enhance the heat transfer between the electrostatic chuck 166 and the substrate 103. In embodiments, the temperature of the substrate may be maintained at −150 degrees Celsius to 450 degrees Celsius, such as −60 degrees Celsius to 300 degrees Celsius, or −30 degrees Celsius to 250 degrees Celsius.

In one embodiment, the substrate support pedestal assembly 148 is configured as a cathode and includes the electrode 180 and the facilities plate/RF electrode 164 that can be coupled to a plurality of RF bias power sources 184, 186. The RF bias power sources 184, 186 are coupled between the electrode 180 and facilities plate/RF electrode 164 disposed in the substrate support pedestal assembly 148 and another electrode, such as the showerhead assembly 130 or ceiling (e.g., lid 104) of the chamber body 102. The RF bias power excites and sustains a plasma discharge (e.g., positive ions) formed from the gases disposed in the processing region of the chamber body 102 and forms a cathode sheath (e.g., negative ions) over a surface of a substrate to accelerate the positive ions towards the surface of the substrate.

In some embodiments the dual RF bias power sources 184, 186 are coupled to the electrode 180 and/or facilities plate/RF electrode disposed in the substrate support pedestal assembly 148 through a matching circuit 188. The signal generated by the RF bias power sources 184, 186 is delivered through matching circuit 188 to the substrate support pedestal assembly 148 through a single feed (e.g., via a coaxial transmission line that is covered by a grounded shield) to ionize the gas mixture provided in the plasma processing chamber such as processing chamber 100, thus providing ion energy necessary for performing an etch, deposition, or other plasma enhanced process. The RF bias power source 184, 186 are generally capable of producing an RF signal having a frequency of from about 50 kHz to about 200 MHz and a power between about 0 Watts and about 15,000 Watts, 1 Watt (W) to about 10,000 W, or about 1 W to about 3,000 W. An additional bias power source 189 (Such as a pulsed DC voltage) may be coupled to the electrode 180 and/or facilities plate/RF electrode 164 to control the characteristics of the plasma.

During operation, the substrate 103 disposed on the substrate support pedestal assembly 148 in the plasma processing chamber such as processing chamber 100. A process gas and/or gas mixture is introduced into the chamber body 102 through the showerhead assembly 130 from the gas panel 158. A vacuum pump system such as pump system 128 maintains the pressure inside the chamber body 102 while removing etch by-products.

A controller 150 is coupled to the processing chamber 100 to control operation (e.g., pressure, temperature, process gas supply, exhaust, etc.) of the processing chamber 100. The controller 150 includes a CPU (central processing unit) 152, a memory 154 (e.g., non-transitory computer readable storage medium), and a support circuit 156 utilized to control process sequences. The CPU 152 may be any form of general-purpose computer processor that may be used in an industrial setting. Software routines can be stored in the memory 154, such as random-access memory, read only memory, floppy, or hard disk drive, or other form of digital storage, as instructions that when executed by a processor (e.g., the CPU 152) perform one or more of the methods described herein. The support circuit 156 is conventionally coupled to the CPU 152 and may include cache, clock circuits, input/output systems, power supplies, and the like. Bi-directional communications between the controller 150 and the various components of the processing chamber 100 are handled through numerous signal cables.

Additionally, the controller 150 is configured for etch control and deposition control using one or more control algorithms which can be stored in the memory 154. For example, the controller 150 is configured to transmit control signals to control a power output from one or more RF generators, e.g., the RF bias power sources 184, 186, 189, and the RF source power 143 during operation. For example, in at least some embodiments, the controller 150 is configured to operate the one or more RF generators as high-peak power radio-frequency generators, e.g., using a control logic circuit. For illustrative purposes, the control logic circuit is described herein as a component of the controller 150. Alternatively or additionally, the control logic circuit can be a component of the one or more RF generators (e.g., the RF bias power sources 184, 186, 189, and the RF source power 143) and/or a matching network (e.g., the matching circuit 188).

Figure 2:
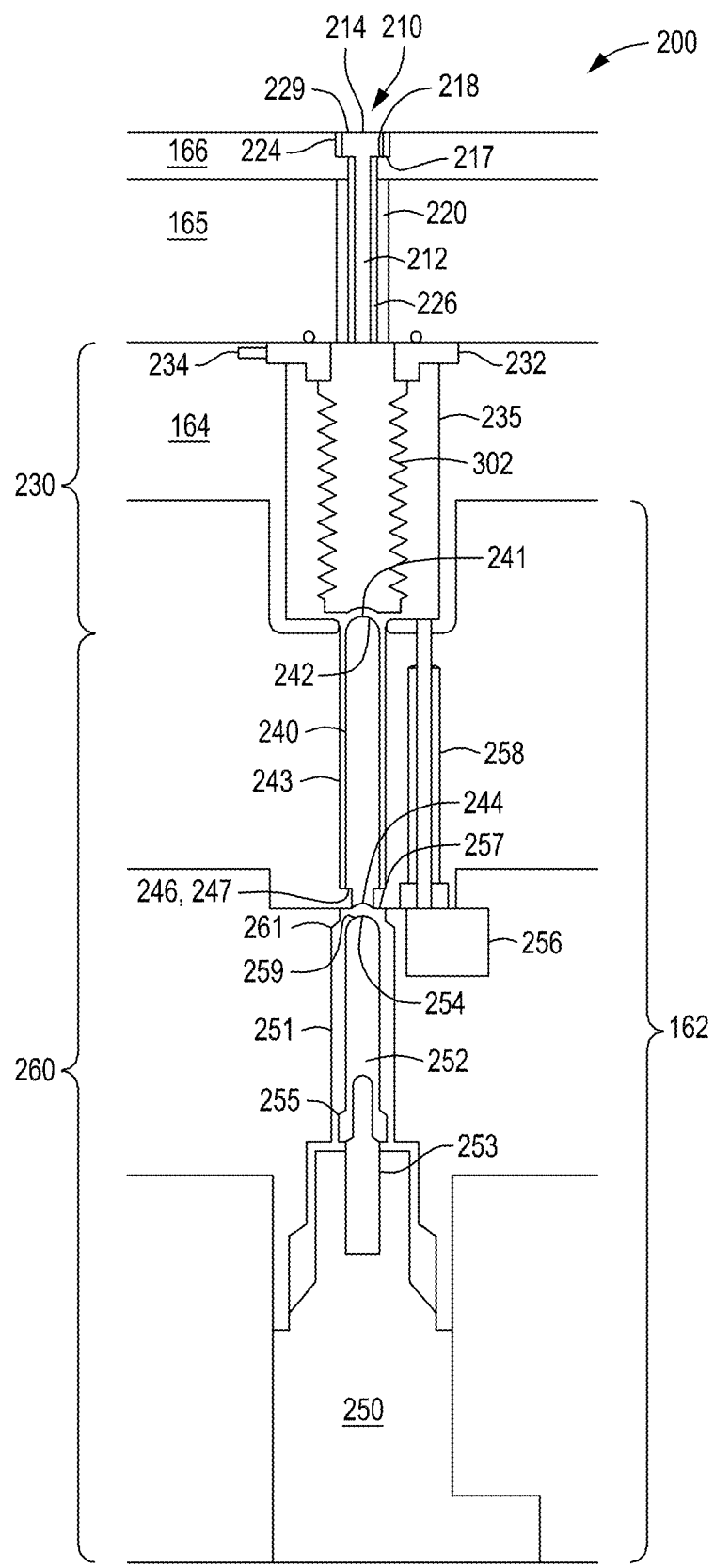
FIG. 2 is a cross-section view of the lift pin mechanism of FIG. 1 in a lift pin down configuration, in accordance with at least some embodiments of the present disclosure.

FIG. 2 is a cross-sectional view of the lift pin mechanism 200 of FIG. 1 in a retracted lift pin configuration, in accordance with at least some embodiments of the present disclosure. The lift pin mechanism 200 is disposed in the substrate support pedestal assembly 148 and across the electrostatic chuck 166, and other plates (e.g., 165, 164, 162) of the substrate support pedestal assembly 148. The specific configuration of such plates shown in FIG. 2 is a non-limiting example, and additional plates or layers may be present. While only a single lift pin mechanism is shown, multiple lift pin mechanisms such as the lift pin mechanisms 200 are disposed in the substrate support pedestal assembly 148. In some embodiments, the substrate support pedestal assembly 148 includes three or more lift pin mechanisms 200.

The lift pin mechanism 200 comprises a lift pin 210, an upper guide 220, a bellows assembly 230 and a bellows push assembly 260. The lift pin 210 includes an elongated shaft 212, a head 214 at the top of the shaft 212, and a coupling end 216 (FIG. 3) at the bottom of the shaft 212. The shaft 212 is elongated, linear, and has a circular cross section. In some embodiments, the shaft 212 has a rectangular cross-section or cross-section of another shape. The coupling end 216 is the end of the shaft 212 opposite the head 214, and the coupling end may be configured for coupling with other components. According to some embodiments, the coupling end 216 is threaded for receiving a screw coupling, has notches to receive click-fit coupling, or includes other coupling mechanisms known in the art.

The lift pin 210 is configured to be disposed in a lift pin hole 224 in the substrate support pedestal assembly 148. The lift pin hole 224 includes an opening in an axial direction in the electrostatic chuck 166, a ledge 217 extending horizontally outward from the opening, and a sidewall extending vertically upward from the ledge 217 toward an upper surface of the electrostatic chuck 166. The ledge 217 complies with the shape of the base 218 of the lift pin 210. The opening has a diameter larger than that of the shaft 212 by a gap 226, but smaller than the diameter of the head 214. In some embodiments, the diameter of the head 214 is about 0.16 inch. In some embodiments, the gap 226 is about 0.002 inch.

The diameter of the sidewall of the lift pin hole 224 is larger than the diameter of the head 214, to accommodate the head 214 therein with a gap. In some embodiments, the gap is about 0.003 inch. When the lift pin 210 is inserted in the lift pin hole 224, the base 218 of the head 214 rests on the ledge 217. The height of the sidewall of the head 214 is equal to or lower than the height of the sidewall of the lift pin hole 224, such that when the lift pin 210 is fully retracted in the lift pin hole 224, the top surface of the head 214 is flush with a top surface of the electrostatic chuck 166, or lower than the top surface of the electrostatic chuck 166.

The upper guide 220 is disposed rigidly in the substrate support pedestal assembly 148 in a longitudinal orientation, and may span a portion of the electrostatic chuck 166 or one or more plates underneath. The upper guide 220 has an opening to allow the shaft 212 to pass through and to facilitate axial movement of the shaft 212 in the upper guide 220. In some embodiments, the upper guide 220 is made from polyphenylene sulfide (PPS).

Figure 3:
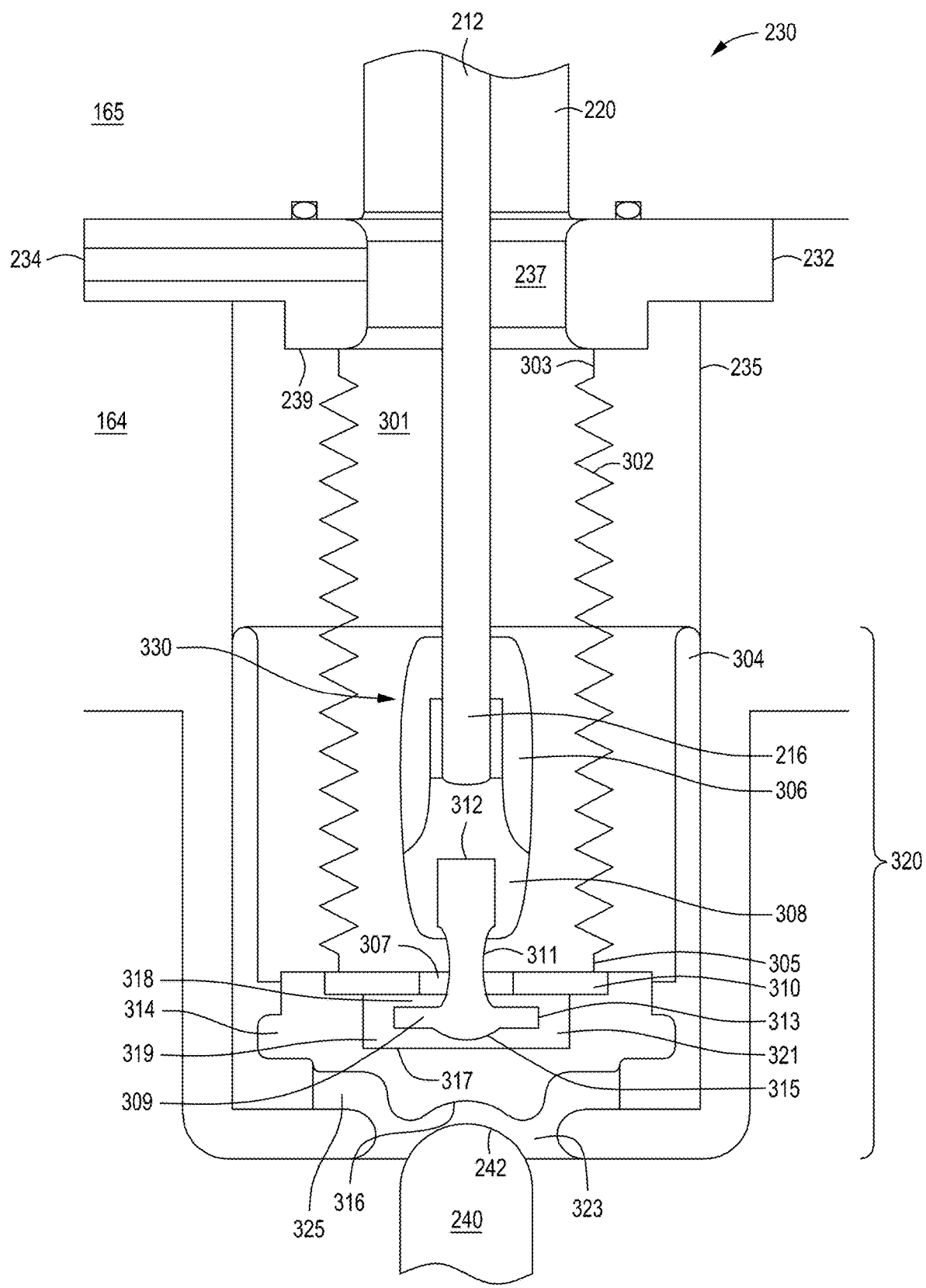
FIG. 3 is a cross section view of a portion of the lift pin mechanism of FIG. 2, in accordance with at least some embodiments of the present disclosure.

FIG. 3 is a cross-sectional view of the bellows assembly 230 portion of the lift pin mechanism 200 of FIG. 2, in accordance with at least some embodiments of the present disclosure. The bellows assembly 230 is disposed in a bellows chamber 235 within an RF hot plate of the substrate support pedestal assembly 148. The bellows assembly 230 comprises a bellows 302 comprising a central volume 301, an upper bellows flange 232 coupled to a first or a top end 303 of the bellows 302 at a lower surface 239 of the upper bellows flange 232, a bellows guide assembly 320 coupled to a second or a bottom end 305 of the bellows 302, and a gripper assembly 330 coupled to the lift pin 210 at the coupling end 216. In operation, the bellows assembly 230 is configured to maintain a vacuum in the central volume 301 of the bellows 302. In some embodiments, the bellows 302 includes a pump port 234 in the upper bellows flange 232 in fluid communication with the central volume 301, to pump out or pressurize the bellows 302. In some embodiments, the bellows 302 are AM350 bellows as generally known in the art. The upper bellows flange 232 has an opening 237 to accept the shaft 212 emerging from the upper guide 220, and to facilitate axial movement of the shaft 212. The shaft 212 emerges from the upper bellows flange 232 into the central volume 301 of the bellows 302 and is rigidly coupled to the gripper assembly 330.

The bellows guide assembly 320 is axially movable with respect to the upper bellows flange 232, and the movement of the bellows guide assembly 320 moves the lift pin 210 axially with respect to the upper bellows flange 232. The gripper assembly 330 cooperates with the bellows guide assembly 320 to move the lift pin 210 in the axial direction. The bellows guide assembly 320 comprises a first bellows guide 304, a second bellows guide 314 and an end plate 310 of the bellows 302. The end plate 310 is rigidly coupled to the bottom end 305 of the bellows 302, and the end plate 310 includes an opening 307 therethrough. The end plate 310 is rigidly coupled to the second bellows guide 314. Also, the end plate 310 is housed in a cavity 321 of the second bellows guide 314. The cavity 321 of the second bellows guide 314 communicates with the central volume 301 via the opening 307. The second bellows guide 314 is rigidly coupled to, and cylindrically enclosed by, the first bellows guide 304. The first bellows guide 304 defines a cylindrical volume for receiving at least a portion of the bellows 302 and facilitating axial movement of the bellows 302 within the cylindrical volume. The second bellows guide 314 includes a bottom end 316, and the first bellows guide 304 has an opening 325 at the bottom end of the bellows guide 304, in which a portion of the second bellows guide 314 comprising the bottom end 316 is disposed. The first bellows guide 304 rests on a ledge of the facilities plate 164, which has an opening 323 aligned with the opening 325, so that the bottom end 316 is accessible through the openings 323 and 325.

The gripper assembly 330 comprises a first gripper 306 rigidly coupled to the coupling end 216 of the lift pin 210, a second gripper 308 rigidly coupled to the first gripper 306, and a stopper 312 rigidly coupled to the second gripper 308. The stopper 312 has an inverted "T" structure, having an elongated portion 311 and a bottom portion 313 having a flange 309 extending horizontally. A top portion of the elongated portion 311 is inserted in and coupled to the second gripper 308, and the rest of the elongated portion 311 emerges axially from the second gripper 308, passes axially through the opening 307 of the end plate 310, and the bottom portion 313 is disposed within the cavity 321. The diameter of the elongated portion 311 is smaller than the diameter of the opening 307, and the diameter of the flange 309 is larger than the diameter of the opening 307, such that the flange 309 is constrained within the cavity 321. The elongated portion 311 has a length such that, in a retracted configuration of the lift pin 210, the bottom portion 313 is suspended at a gap 318 from the end plate 310 and a gap 319 from an internal base surface 317 of the second bellows guide 314. In some embodiments, the stopper 312 includes a gimbal 315 facing the internal base surface 317, in the center of the of the flange 309. Due to the rigid coupling between the lift pin 210, the first gripper 306, the second gripper 308 and the stopper 312, an axial movement of the stopper 312 translates to an axial movement of the lift pin 210.

As shown in FIG. 2, the bellows push assembly 260 includes a first push rod 240, a second push rod 252 and an actuator 250 having a third push rod 253. The first push rod 240 is axially movable within a guide channel 243, and through the openings 325 and 323 in a facilities plate 164 to contact the bottom end 316 of the second bellows guide 314. The first push rod 240 comprises a shoulder 246 configured to engage with a ledge 247 in the guide channel 243 preventing a downward movement of the first push rod 240 through the opening 257. In the retracted configuration, the shoulder 246 rests on the ledge 247, and the first push rod 240 is suspended such that there is a gap 241 between the bottom end 316 and the top end 242 of the first push rod 240, and a bottom end 244 of the first push rod 240 does not extend through the opening 257. The first push rod 240 is mechanically decoupled with the bellows guide assembly 320 in the retracted configuration.

The second push rod 252 and the third push rod 253 are axially movable within a guide channel 251, and though an opening 257 between the guide channels 243 and 251. The actuator 250 is configured to impart an axial force to the third push rod 253, causing the third push rod 253 to move axially. In some embodiments, the actuator 250 is a motor with a captive lead screw such as the third push rod 253. The third push rod 253 is rigidly coupled with the second push rod 252, such that the axial movement of the third push rod 253 causes a corresponding axial movement of the second push rod 252. In the retracted configuration, the second push rod 252 is separated by a gap 259 with the first push rod 240, and the second push rod 252 is mechanically decoupled with the first push rod 240. The second push rod 252 has a shoulder 255 and the guide channel 251 has a ledge 261. In some embodiments, the range of axial displacement of the second push rod 252 caused by of the actuator 250 is controlled (e.g., by a motor encoder) thereby preventing the shoulder 255 and the ledge 261 from contacting one another.

The first bellows guide 304 is movable axially within the bellows chamber 235. The second bellows guide 314 and the end plate 310, which are rigidly coupled to the first bellows guide 304. The upward axial motion of the second bellows guide 314 causes a corresponding axial motion of the first bellows guide 304, and the end plate 310, thereby compressing the bellows 302, as the bellows guide assembly 320 moves axially upward toward the upper bellows flange 232. Further, the upward axial motion of the second bellows guide 314 causes the internal base surface 317 to push the gimbal 315 (if present) or the bottom portion 313 of the stopper 312 in an axially upward direction, which in turn translates to an axially upward movement of the lift pin 210.

In the retracted configuration shown in FIGS. 2 and 3, the bellows 302 is installed with a spring force to bias the bellows guide assembly 320 axially downward. The spring rate of the bellows 302 is greater than an upward atmospheric pressure force on the bellows 302, resulting in a pre-load force which biases the bellows guide assembly 320 axially downward. The pre-load force is configured to cause elongation of the bellows 302 such that the bellows guide assembly 320 comes to a stop at a base of the bellows chamber 235 defined in the facilities plate 164. In the retracted configuration, the bottom portion 313 of the stopper 312 is suspended in the cavity 321 at the gap 318 with the end plate 310, and the gap 319 with the internal base surface 317.

A motion sensor 256 is optically coupled, for example, via an optical channel 258, to the bellows guide assembly 320. The motion sensor 256 is configured to detect a position of at least one of the bellows 302, or the bellows guide assembly 320. A controller, such as the controller 150 or a similar controller, utilizes the detected position to determine correct operation of the bellows 302. For example, if the bellows 302 does not expand upon activating a retracted configuration, the controller may generate an alert, or otherwise modify operation of the processing chamber 100. In some embodiments, the motion sensor 256 is embedded in one of the plates of the substrate support pedestal assembly 148.

In some embodiments, the lift pin 210 comprises $Al_2O_3$, the upper guide comprises PPS and/or $Al_2O_3$, the first gripper 306 and the second gripper 308 comprise aluminum or stainless steel, one or more of the push rods 240, 252, 253 include Torlon®. Various other components of the lift pin mechanisms disclosed herein may comprise materials such as polyether ether ketone (PEEK), polytetrafluoroethylene (PTFE), polyphenylene sulfide (PPS) and Vespel® Polyimide. In some embodiments, the bellows are AM350 bellows.

Figure 4:
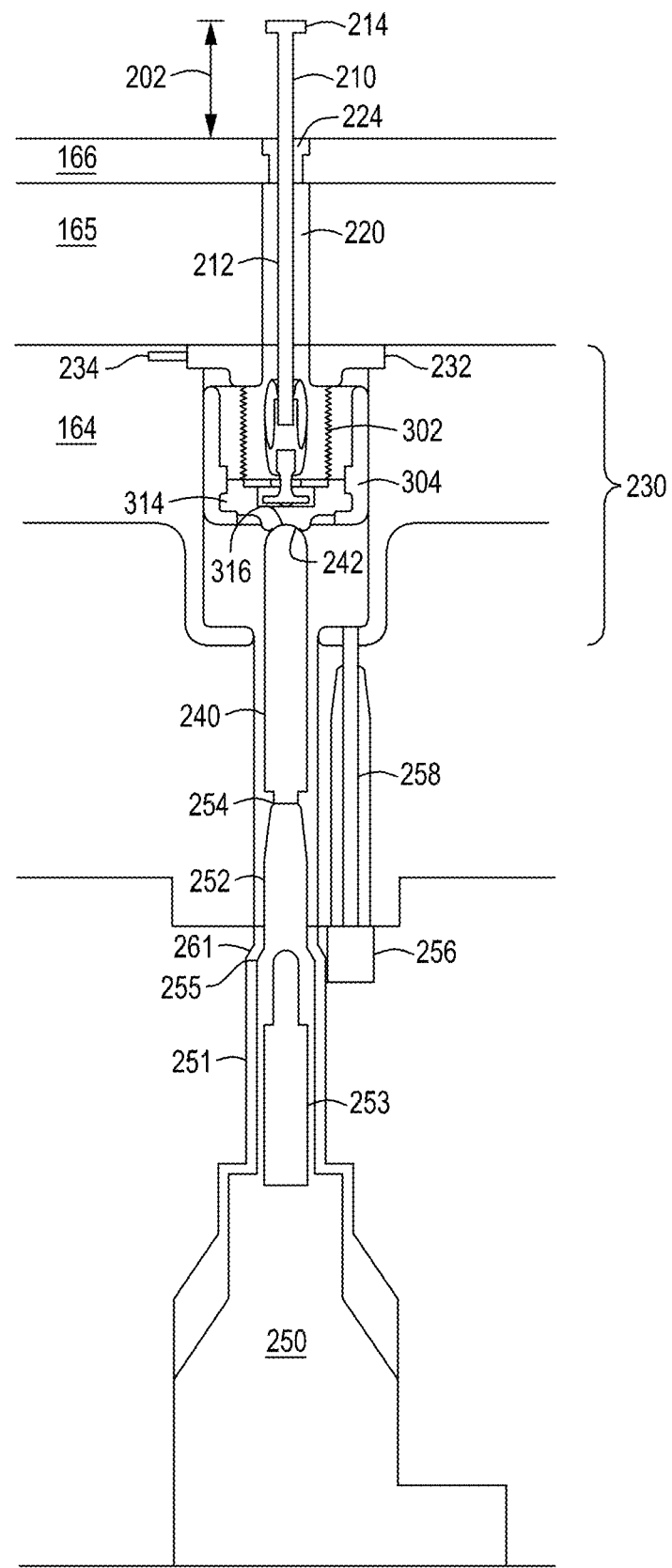
FIG. 4 is a cross section view of the lift pin mechanism of FIG. 1 in a lift pin up configuration, in accordance with at least some embodiments of the present disclosure.

FIG. 4 is a cross-sectional view of the lift pin mechanism 200 of FIG. 1 in a lifted configuration of the lift pin 210, in accordance with at least some embodiments of the present disclosure. To achieve the lifted configuration, the third push rod 253 moves the second push rod 252 to the predetermined height, such that the second push rod 252 comes to a stop due the engagement with the ledge 261 in the guide channel 251. The second push rod 252 moves axially upward, covering the gap 259, and pushing the first push rod 240. The first push rod 240, in turn moves axially upward, covering the gap 241, and pushing the bottom end 316 of the second bellows guide 314 in an axially upward direction. The upward axial motion of the second bellows guide 314 causes the upward axial motion of the bellows guide assembly 320, which as explained above, causes the bellows 302 to compress, and the lift pin 210 to be lifted and emerge out of the lift pin hole 224 in the electrostatic chuck 166.

Figure 5:
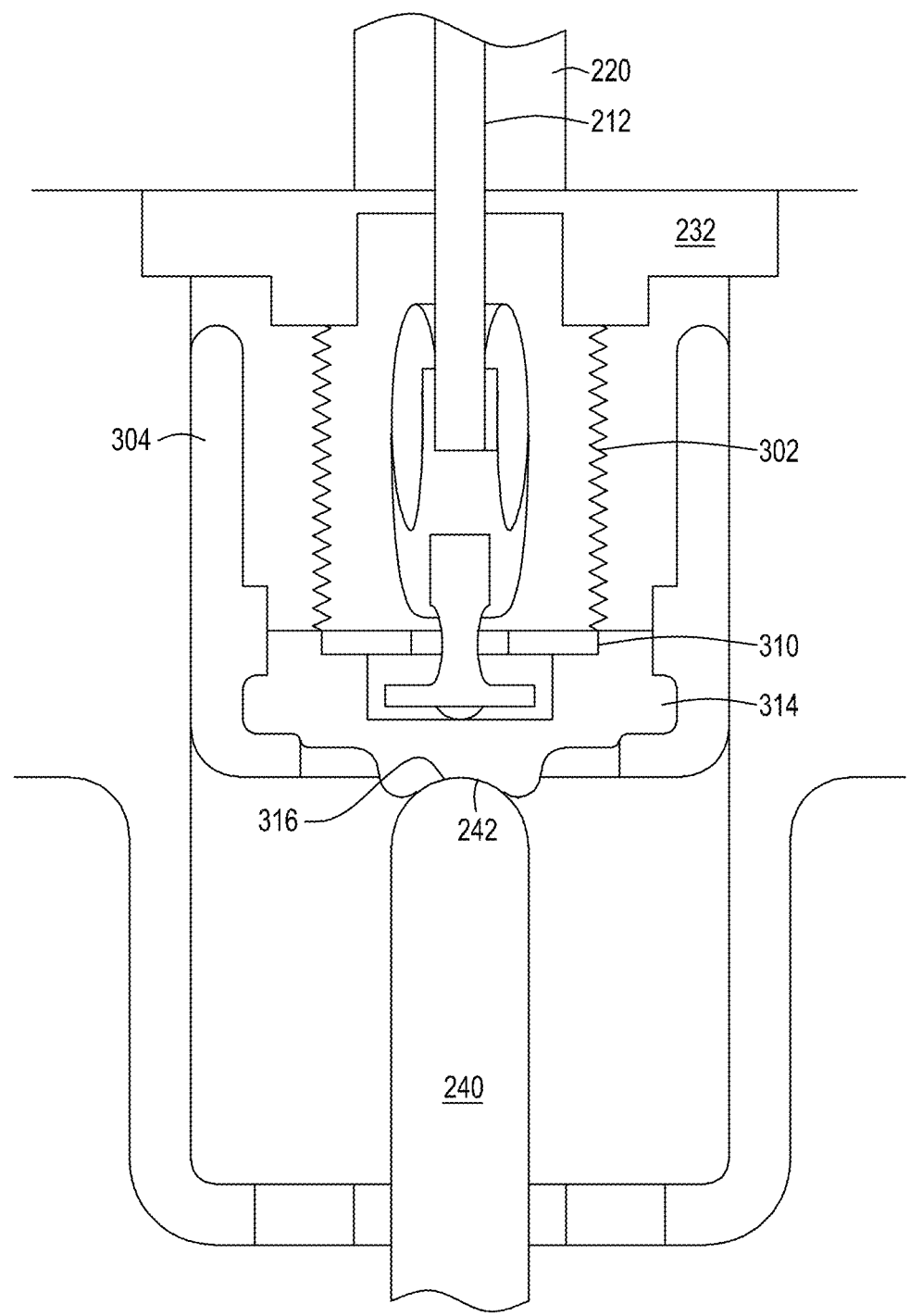
FIG. 5 is a cross section view of a portion of the lift pin mechanism of FIG. 4, in accordance with at least some embodiments of the present disclosure.

FIG. 5 is a cross-sectional view of the bellows assembly 230 portion of the lift pin mechanism 200 of FIG. 4, in accordance with at least some embodiments of the present disclosure. FIGS. 4 and 5 show that in the lifted configuration, the head 214 of the lift pin 210 achieves a height 202 from a top surface of the electrostatic chuck 166. The top end 254 of the second push rod 252 is in direct contact with the bottom end 244 of the first push rod 240. The top end 242 of the first push rod 240 is in direct contact with the bottom end 316 of the second bellows guide 314. The second push rod 252 is constrained in the upward motion by the ledge 261, and dimensions of all linear elements, such as the push rods, the gaps, the stopper, the grippers, and the lift pin are configured to achieve the height 202.

Figure 6:
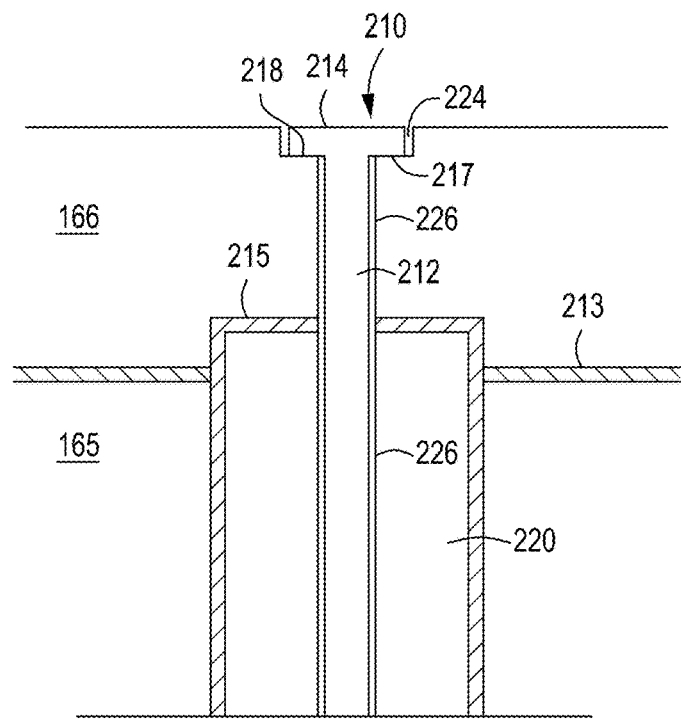
FIG. 6 is a cross section view of a portion of the lift pin assembly of FIG. 1 in accordance with at least some embodiments of the present disclosure.

FIG. 6 is a cross-sectional view of a portion of the lift pin mechanism 200 of FIG. 1, in the retracted configuration, in accordance with at least some embodiments of the present disclosure. A base 218 of the head 214 of the lift pin 210 rests on a ledge 217 of the lift pin hole 224 in the electrostatic chuck 166. A guide channel 226 provides an opening to facilitate an axial movement of the shaft 212 therethrough to the upper guide 220. A filler 215 is provided between the upper guide 220 and the electrostatic chuck 166 and the plate 165, and a filler 213 is provided between the electrostatic chuck 166 and the plate 165. In the retracted configuration, the base 218 makes close contact with the ledge 217, which along with the fillers 213 and 215 act as a barrier to prevent or reduce lift pin arcing. In some embodiments, the base 218 and/or the ledge 217 has a surface finish Ra, between about 4 microinches to about 64 microinches. In some embodiments, the lift pin mechanism 200 is configured to bias the head 214 to exert a force at least equal to the weight of the lift pin 210 and the gripper assembly 330 (e.g., about 0.01 lbs to 10 lbs) on the electrostatic chuck 166.

Figure 7:
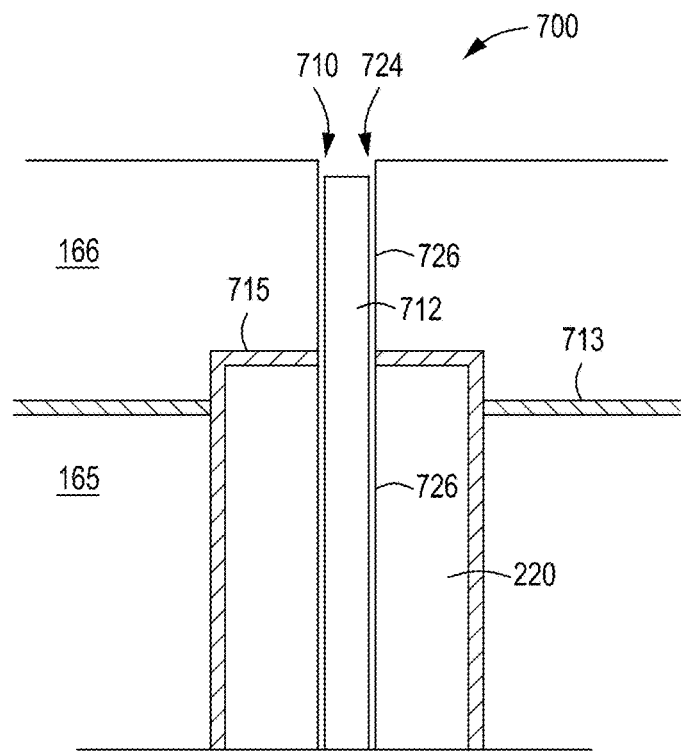
FIG. 7 is a cross section view of a portion of a lift pin assembly in accordance with at least some embodiments of the present disclosure.

FIG. 7 is a cross-sectional view of a portion of a lift pin mechanism 700 in the retracted configuration, in accordance with at least some embodiments of the present disclosure. The lift pin mechanism 700 is similar to the lift pin mechanism 200 as shown in FIG. 6, except for that a lift pin 710 of the lift pin mechanism 700 differs from the lift pin 210 of the lift pin mechanism 200. The lift pin 710 includes a shaft 712 inserted in a corresponding lift pin hole 724. Unlike the lift pin 210, which includes a head, the lift pin 710 does not include a head, and is a straight pin, and correspondingly, unlike the lift pin hole 224, which includes the ledge 217, the lift pin hole 724 does not include a ledge. A guide channel 726 provides an opening to facilitate an axial movement of the shaft 712 therethrough to the upper guide 220. A filler 715 is provided between the upper guide 220 and the electrostatic chuck 166 and the plate 165, and a filler 713 is provided between the electrostatic chuck 166 and the plate 165. In the retracted configuration, the lift pin 710 rests in a recessed position in the lift pin hole 724, with a top of the lift pin 710 being lower than the top surface of the electrostatic chuck. The fillers 713 and 715 act as a barrier to prevent or reduce lift pin arcing.

Figure 8:
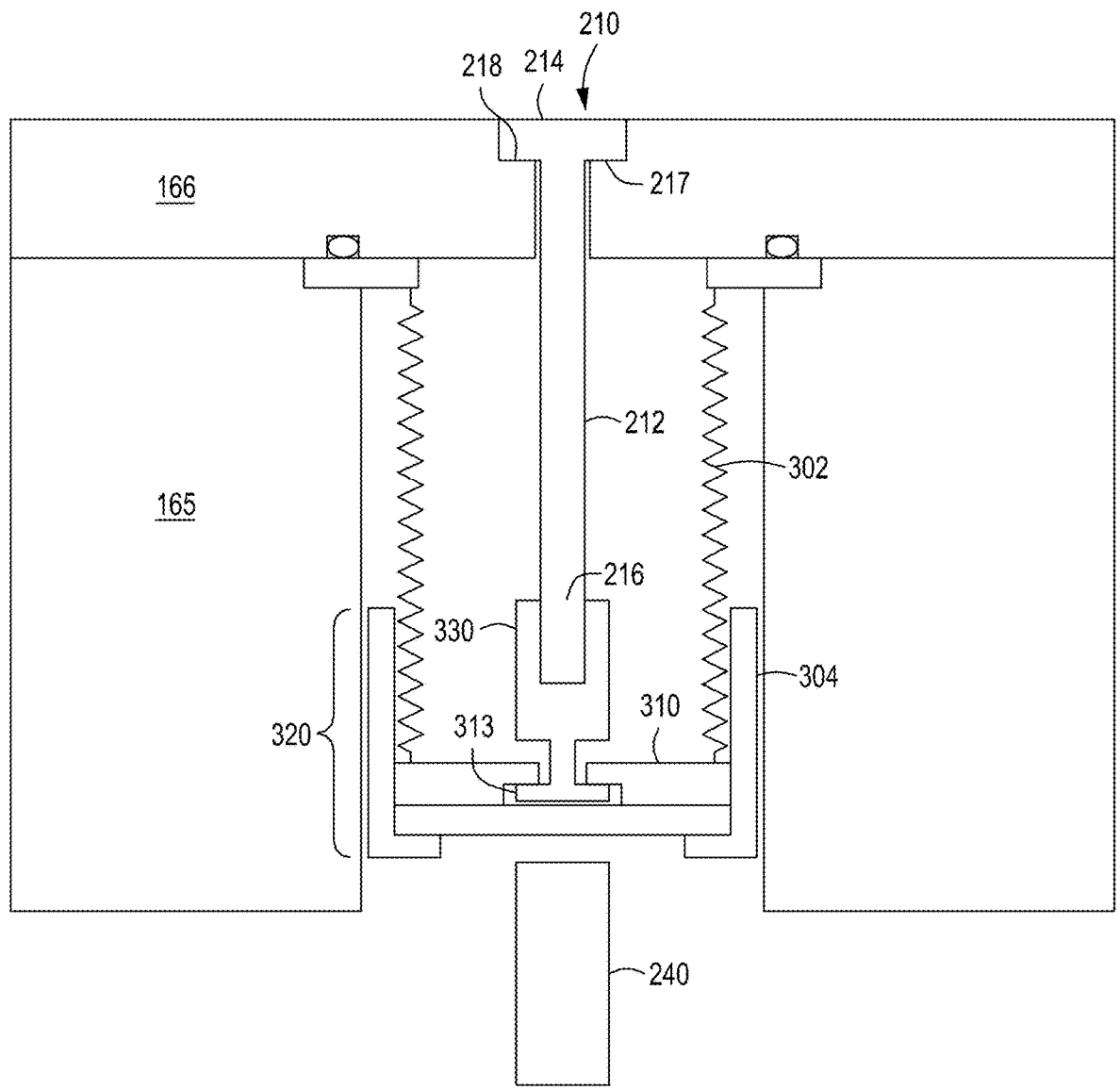
FIG. 8 is a schematic representation of the operation of the lift pin mechanism in accordance with at least some embodiments of the present disclosure.

FIG. 8 is a schematic representation of the operation of the lift pin mechanism 200 in accordance with at least some embodiments of the present disclosure, in which the lift pin mechanism 200 is in a retracted configuration, such that the lift pin 210 is fully retracted into the electrostatic chuck 166. Unlike the configuration of FIG. 3, in which a downward axial motion of the bellows guide assembly 320 is constrained by a ledge provided by the facilities plate 164 or by a ledge in the bellows chamber 235, in the configuration shown by FIG. 8, the bellows guide assembly 320 does not have a ledge to constrain the downward motion thereof. Instead, the downward motion of the bellows guide assembly 320 is constrained by the head 214 of the lift pin 210. In particular, the base 218 of the head 214 of the lift pin 210 rests on the ledge 217 of the lift pin hole in the electrostatic chuck 166. The lift pin 210 is rigidly coupled with the gripper assembly 330, which by engagement of the bottom portion 313 and the end plate 310, supports the bellows guide assembly 320, and, thus, the base 218 of the head 214 bears a preload. The preload is configured to a desired value by configuring the spring force of the bellows 302 such that, when counterbalanced by the force of the atmospheric pressure, a desired preload is achieved on the base 218 of the lift pin 210.

While the foregoing is directed to embodiments of the present disclosure, other and further embodiments of the disclosure may be devised without departing from the basic scope thereof.

The invention claimed is:

1. A lift pin mechanism, comprising:
   a lift pin comprising an elongated shaft, a top end of the shaft, a bottom end of the shaft, and a coupling end at the bottom end of the shaft;
   a bellows assembly disposed about the shaft, the bellows assembly comprising:
      an upper bellows flange having an opening to facilitate axial movement of the shaft therethrough;
      a bellows having a first end coupled to a lower surface of the upper bellows flange such that the shaft extends into a central volume surrounded by the bellows; and
      a bellows guide assembly coupled to a second end of the bellows to seal the central volume proximate the second end of the bellows, wherein the shaft is coupled to the bellows guide assembly at the coupling end of the shaft, and wherein the bellows guide assembly is axially movable with respect to the upper bellows flange such that axial movement of the bellows guide assembly with respect to the upper bellows flange axially moves the lift pin with respect to the upper bellows flange,
      wherein the bellows guide assembly includes a first bellows guide at least partially surrounding an outer vertical side of the bellows, the first bellows guide defining a cylindrical volume for a portion of the bellows.

2. The lift pin mechanism of claim 1, wherein the bellows guide assembly comprises:
   a second bellows guide coupled to the first bellows guide, and to an end plate located at the second end of the bellows, the first bellows guide and the second bellows guide movable in an axial direction.

3. The lift pin mechanism of claim 2, further comprising a bellows push assembly comprising:
   a first push rod movable along an axial direction, the first push rod comprising a top end, a bottom end having a diameter smaller than the top end, the first push rod positioned below the second bellows guide, wherein a bottom end of the second bellows guide is shaped to mate with the top end of the first push rod;

a second push rod movable along the axial direction, the second push rod comprising a top end and a bottom end, the second push rod positioned below the first push rod, wherein the bottom end of the first push rod is shaped to mate with the top end of the second push rod; and an actuator comprising a third push rod coupled with the bottom end of the second push rod, the actuator configured to move the third push rod in the axial direction.

4. A lift pin mechanism, comprising:
a lift pin comprising an elongated shaft, a top end of the shaft, a bottom end of the shaft, and a coupling end at the bottom end of the shaft;
a bellows assembly disposed about the shaft, the bellows assembly comprising:
an upper bellows flange having an opening to facilitate axial movement of the shaft therethrough;
a bellows having a first end coupled to a lower surface of the upper bellows flange such that the shaft extends into a central volume surrounded by the bellows; and
a bellows guide assembly coupled to a second end of the bellows to seal the central volume proximate the second end of the bellows, wherein the shaft is coupled to the bellows guide assembly at the coupling end of the shaft, and wherein the bellows guide assembly is axially movable with respect to the upper bellows flange such that axial movement of the bellows guide assembly with respect to the upper bellows flange axially moves the lift pin with respect to the upper bellows flange,
wherein the bellows guide assembly comprises:
a first bellows guide defining a cylindrical volume for a portion of the bellows; and
a second bellows guide coupled to the first bellows guide, and to an end plate located at the second end of the bellows, the first bellows guide and the second bellows guide movable in an axial direction,
wherein the coupling of the shaft to the bellows comprises:
a first gripper coupled to the coupling end of the shaft;
a second gripper coupled to the first gripper;
a stopper comprising:
a top portion coupled to the second gripper;
an elongated portion passing through a central opening of the end plate; and
a bottom portion positioned in a cavity defined by the end plate and the second bellows guide, the bottom portion comprising:
a flange having a diameter larger than a diameter of the central opening of the end plate; and
a gimbal at a center of the flange and facing the second bellows guide.

5. A lift pin mechanism, comprising:
a lift pin comprising an elongated shaft, a top end of the shaft, a bottom end of the shaft, and a coupling end at the bottom end of the shaft;
a bellows assembly disposed about the shaft, the bellows assembly comprising:
an upper bellows flange having an opening to facilitate axial movement of the shaft therethrough;
a bellows having a first end coupled to a lower surface of the upper bellows flange such that the shaft extends into a central volume surrounded by the bellows;
a bellows guide assembly coupled to a second end of the bellows to seal the central volume proximate the second end of the bellows, wherein the shaft is coupled to the bellows guide assembly at the coupling end of the shaft, and wherein the bellows guide assembly is axially movable with respect to the upper bellows flange such that axial movement of the bellows guide assembly with respect to the upper bellows flange axially moves the lift pin with respect to the upper bellows flange; and
a motion sensor optically coupled to the bellows guide assembly and configured to detect a position of at least one of the bellows, or the bellows guide assembly.

6. The lift pin mechanism of claim 1, wherein the top end comprises a head, and wherein a base of the head has a Ra surface finish between about 4 and 64 microinches.

7. A lift pin mechanism, comprising:
a lift pin comprising an elongated shaft, a top end of the shaft, a bottom end of the shaft, and a coupling end at the bottom end of the shaft;
a bellows assembly disposed about the shaft, the bellows assembly comprising:
an upper bellows flange having an opening to facilitate axial movement of the shaft therethrough;
a bellows having a first end coupled to a lower surface of the upper bellows flange such that the shaft extends into a central volume surrounded by the bellows; and
a bellows guide assembly coupled to a second end of the bellows to seal the central volume proximate the second end of the bellows, wherein the shaft is coupled to the bellows guide assembly at the coupling end of the shaft, and wherein the bellows guide assembly is axially movable with respect to the upper bellows flange such that axial movement of the bellows guide assembly with respect to the upper bellows flange axially moves the lift pin with respect to the upper bellows flange,
wherein the top end comprises a head, and wherein a base of the head has a Ra surface finish between about 4 and 64 microinches,
wherein the lift pin is configured to be inserted in a lift pin hole formed in an electrostatic chuck, the lift pin hole comprising:
an opening for the shaft of the lift pin; and
a ledge extending outward and optionally upward from the opening of the shaft;
wherein the base of the head is shaped to make close contact with the ledge when the lift pin is in a retracted configuration; and
wherein the top of the head is flush with a top surface of the electrostatic chuck when the lift pin is in the retracted configuration.

8. The lift pin mechanism of claim 7, wherein the head extends horizontally outward from the shaft, the head and the shaft forming a "T" shape.

9. The lift pin mechanism of claim 7, wherein the lift pin hole comprises a sidewall extending vertically upward from the ledge to an upper surface of the electrostatic chuck.

10. The lift pin mechanism of claim 1, wherein the top end and the shaft form a straight pin.

11. The lift pin mechanism of claim 1, further comprising:
an upper guide comprising a top end, a bottom end, and a first opening extending from the top end to the bottom end, wherein the shaft is disposed through and axially movable through the first opening.

12. A substrate support, comprising:
a support plate configured to support a substrate; and a plurality of lift pin mechanisms according to claim 1 disposed within the substrate support.

13. The substrate support of claim 12, wherein the support plate comprises an electrostatic chuck.

14. The substrate support of claim 13, wherein the support plate further comprises a conductive plate disposed beneath the electrostatic chuck, wherein the bellows assembly is disposed within the conductive plate.

15. A substrate support, comprising:
- an electrostatic chuck;
- a mounting plate;
- a radio frequency (RF) electrode disposed between the electrostatic chuck and the mounting plate; and
- a plurality of lift pin mechanisms according to claim 1 disposed within the substrate support and configured to allow a corresponding plurality of lift pins to pass through the electrostatic chuck.

16. The substrate support of claim 15, wherein the bellows guide assembly comprises:
- a first bellows guide defining a cylindrical volume, and
- a second bellows guide coupled to the first bellows guide, and to an end plate located at the second end of the bellows, the first bellows guide and the second bellows guide movable in an axial direction.

17. The substrate support of claim 16, wherein each lift pin mechanism further comprises:
- a first push rod movable along an axial direction, the first push rod comprising a top end, a bottom end having a diameter smaller than the top end, the first push rod positioned in a corresponding shaped opening in the mounting plate, and below the second bellows guide, wherein a bottom end of the second bellows guide is shaped to mate with the top end of the first push rod, and wherein a downward movement of the first push rod is limited by the mounting plate;
- a second push rod movable along the axial direction, the second push rod comprising a top end and a bottom end, the second push rod positioned below the first push rod, wherein the bottom end of the first push rod is shaped to mate with the top end of the second push rod; and
- an actuator comprising a third push rod coupled with the bottom end of the second push rod, the actuator configured to move the third push rod in an axial direction.

18. The substrate support of claim 16, wherein the coupling of the shaft to the bellows comprises:
- a first gripper coupled to the coupling end of the shaft;
- a second gripper coupled to the first gripper; and
- a stopper comprising:
  - a top portion coupled to the second gripper;
  - an elongated portion passing through a central opening of the end plate; and
  - a bottom portion positioned in a cavity defined by the end plate and the second bellows guide, the bottom portion comprising:
    - a flange having a diameter larger than a diameter of the central opening of the end plate; and
    - a gimbal at a center of the flange and facing the second bellows guide.

19. The substrate support of claim 15, wherein the electrostatic chuck includes a lift pin hole, the lift pin is configured to be inserted in the lift pin hole, and the lift pin hole comprises:
- an opening for the shaft of the lift pin; and
- a ledge extending outward and optionally upward from the opening of the shaft;
- wherein a base of a head of the lift pin is shaped to make close contact with the ledge when the lift pin is in a retracted configuration; and
- wherein a top of the head of the lift pin is flush with a top surface of the electrostatic chuck when the lift pin is in the retracted configuration.

20. The substrate support of claim 15, wherein the mounting plate further comprises a conductive plate disposed beneath the electrostatic chuck, wherein the bellows guide assembly is disposed within the conductive plate.

* * * * *